(12) United States Patent
Kinoshita et al.

(10) Patent No.: US 9,419,133 B2
(45) Date of Patent: Aug. 16, 2016

(54) SEMICONDUCTOR DEVICE AND FABRICATION METHOD OF SEMICONDUCTOR DEVICE

(71) Applicant: FUJI ELECTRIC CO., LTD., Kawasaki-shi, Kanagawa (JP)

(72) Inventors: Akimasa Kinoshita, Tsukuba (JP); Takashi Tsuji, Tsukuba (JP); Kenji Fukuda, Tsukuba (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 14/397,150

(22) PCT Filed: Mar. 18, 2013

(86) PCT No.: PCT/JP2013/057743
§ 371 (c)(1),
(2) Date: Oct. 24, 2014

(87) PCT Pub. No.: WO2013/161449
PCT Pub. Date: Oct. 31, 2013

(65) Prior Publication Data
US 2015/0115285 A1    Apr. 30, 2015

(30) Foreign Application Priority Data

Apr. 27, 2012 (JP) ................... 2012-104234

(51) Int. Cl.
*H01L 29/66* (2006.01)
*H01L 29/12* (2006.01)
(Continued)

(52) U.S. Cl.
CPC ...... *H01L 29/7839* (2013.01); *H01L 21/02664* (2013.01); *H01L 29/0615* (2013.01);
(Continued)

(58) Field of Classification Search
CPC . H01L 29/7839; H01L 29/161; H01L 29/872; H01L 29/402

USPC .............. 257/77, 493, 688, E29.104
See application file for complete search history.

(56) References Cited

U.S. PATENT DOCUMENTS

2007/0018171 A1  1/2007 Harris et al.
2009/0173949 A1  7/2009 Yatsuo et al.
(Continued)

FOREIGN PATENT DOCUMENTS

JP  2007-234925 A  9/2007
JP  2008-034646 A  2/2008
(Continued)

OTHER PUBLICATIONS

Notification of Transmittal of Transmittal of the International Preliminary Report on Patentability (Forms PCT/IB/326) of International Application No. PCT/JP2013/057743 mailed on Nov. 6, 2014 with Forms PCT/IB/373, PCT/IB/338 and PCT/ISA/237 with English Translation.
(Continued)

*Primary Examiner* — Kimberly Rizkallah
*Assistant Examiner* — Brian Turner
(74) *Attorney, Agent, or Firm* — Westerman, Hattori, Daniels & Adrian, LLP (57) ABSTRACT

$P^+$ type regions and a p-type region are selectively disposed in a surface layer of a silicon carbide substrate base. The $P^+$ type region is disposed in a breakdown voltage structure portion surrounding an active region. The $P^+$ type region is disposed in the active region to make up a JBS structure. The p-type region surrounds the $P^+$ type region to make up a junction termination (JTE) structure. A Schottky electrode forms a Schottky junction with an n-type silicon carbide epitaxial layer. The Schottky electrode overhangs an interlayer insulation film covering a portion of the $P^+$ type region and the p-type region and this overhanging portion acts as a field plate. This enables the provision of a semiconductor device configured by using a wide band gap semiconductor capable of maintaining a high breakdown voltage with high reliability, and a method of fabricating thereof.

17 Claims, 6 Drawing Sheets

(51) Int. Cl.
*H01L 29/24* (2006.01)
*H01L 29/06* (2006.01)
*H01L 29/78* (2006.01)
*H01L 29/872* (2006.01)
*H01L 29/40* (2006.01)
*H01L 29/20* (2006.01)
*H01L 29/417* (2006.01)
*H01L 21/02* (2006.01)
*H01L 29/10* (2006.01)
*H01L 29/04* (2006.01)
*H01L 29/16* (2006.01)

(52) U.S. Cl.
CPC ........ *H01L29/0619* (2013.01); *H01L 29/0661* (2013.01); *H01L 29/1095* (2013.01); *H01L 29/2003* (2013.01); *H01L 29/402* (2013.01); *H01L 29/41741* (2013.01); *H01L 29/6606* (2013.01); *H01L 29/66477* (2013.01); *H01L 29/7802* (2013.01); *H01L 29/7811* (2013.01); *H01L 29/872* (2013.01); *H01L 29/045* (2013.01); *H01L 29/1608* (2013.01)

(56) References Cited

U.S. PATENT DOCUMENTS

2010/0291762 A1* 11/2010 Tarui .................... H01L 21/046
 438/519
2011/0195563 A1* 8/2011 Okuno ................ H01L 21/0465
 438/518
2011/0233714 A1* 9/2011 Lu ..................... H01L 29/66348
 257/493
2012/0187419 A1* 7/2012 Elpelt ................. H01L 29/0843
 257/77
2014/0145289 A1* 5/2014 Zhang ................. H01L 29/6606
 257/475

FOREIGN PATENT DOCUMENTS

JP 2009-502040 A 1/2009
JP 2010-050147 A 3/2010
JP 2010-087483 A 4/2010

OTHER PUBLICATIONS

International Search Report dated Jun. 11, 2013, issued in corresponding application No. PCT/JP2013/057743.
Shenai, Krishna, et al., "Optimum Semiconductors for High-Power Electronics", IEEE Transactions on Electron Devices, Sep. 1989, vol. 36, No. 9, pp. 1811-1823.
Baliga, B. Jayant, "Silicon Carbide Power Divices", World Scientific Publishing Co, USA, Mar. 30, 2006, (9 pages).

* cited by examiner

SEMICONDUCTOR DEVICE AND FABRICATION METHOD OF SEMICONDUCTOR DEVICE

TECHNICAL FIELD

The present invention relates to a semiconductor device and a fabrication method of a semiconductor device.

BACKGROUND ART

Silicon (Si) is conventionally used as a material for power semiconductor devices controlling high voltage and large current. The power semiconductor devices fall into several types, such as bipolar transistors, insulated gate bipolar transistors (IGBTs), and metal-oxide semiconductor field-effect transistors (MOSFET), and are selectively used according to the intended use.

For example, bipolar transistors and IGBTs cannot be switched at high speed although higher current density enables larger current as compared to MOSFETs. For example, the use of bipolar transistors is limited up to a switching frequency of several kHz and the use of IGBTs is limited up to tens of kHz. On the other hand, power MOSFETs can perform high-speed switching operation, although lower current density makes it difficult to handle larger current as compared to bipolar transistors and IGBTs.

Nonetheless, since a power semiconductor device supporting both large current and high-speed performance is strongly demanded in the market, efforts are made to improve IGBTs and power MOSFETs, which have been substantially developed closely to the material limits the performance of power devices substantially reaches the theoretical limit decided by materials. Semiconductor materials replacing silicon are studied in terms of power semiconductor devices and silicon carbide (SiC) is attracting attention as a semiconductor material that can be used for producing (fabricating) a next generation power semiconductor device having excellent low ON-voltage, high-speed characteristics, and high-temperature characteristics (see Non-Patent Literature 1).

Chemically, silicon carbide is a very stable semiconductor material with a wide band gap of 3 eV and can be used very stably as a semiconductor even at high temperatures. Silicon carbide has a critical electric field that is at least 10-fold that of silicon and therefore, is expected to be used as a semiconductor material capable of making ON-resistance sufficiently small. Such features of silicon carbide are the same as those of other wide band gap semiconductors, for example, gallium nitride (GaN). Therefore, by using wide band gap semiconductors, a higher breakdown voltage of a semiconductor device can be achieved (see, e.g., Non-Patent Literature 2).

However, in a high-voltage semiconductor device, high voltage is applied not only to an active region in which element structure is formed, but also to a breakdown voltage structure portion disposed in a peripheral portion of the active region to retain breakdown voltage and an electric field concentrates on the breakdown voltage structure portion. The breakdown voltage of a high-breakdown semiconductor device is determined by the impurity concentration, thickness, and field intensity; and breakdown tolerance, which is determined by semiconductor specific features, in this way is equal across the active region and the breakdown voltage structure portion. Therefore, when an electric field concentrates on the breakdown voltage structure portion, an electric load exceeding the breakdown tolerance may be applied to the breakdown voltage structure portion and may cause destruction.

A semiconductor device having a breakdown voltage structure portion provided with a termination structure such as a junction termination (junction termination extension (JTE)) structure and a field limiting ring (FLR) structure is known as a high-voltage semiconductor device that improves the breakdown voltage of the entire device by alleviating or dispersing the electric field of the breakdown voltage structure portion. In a known semiconductor device, a floating metal electrode in contact with the FLR is disposed as a field plate (FP) to release electric charge generated in the breakdown voltage structure portion to improve reliability (see, e.g., Patent Document 1).

Patent Document 1: Japanese Laid-Open Patent Publication No. 2010-50147

Non-Patent Literature 1: K. Shenai, et al, "Optimum Semiconductors for High-Power Electronics", IEEE Transactions on Electron Devices, Vol. 36, No. 9, September 1989, pp. 1811-1823

Non-Patent Literature 2: B. Jayant Baliga, "Silicon Carbide Power Devices", (USA), World Scientific Publishing Co, Mar. 30, 2006, p. 61

DISCLOSURE OF INVENTION

Problem to be Solved by the Invention

Nonetheless, the termination structure such as the JTE structure and the FLR structure described above is a structure for improving the breakdown voltage, defined as initial characteristic in the specifications of the semiconductor device, and the breakdown voltage may considerably fluctuate depending on the environment in which the semiconductor device is used, possibly causing drops in the reliability of the semiconductor device. For example, under high-temperatures or in a high-humidity environment, the electric field generated during operation of the semiconductor device causes charged ions present as impurities in resin such as sealing material protecting the semiconductor, or metal ions generated by corrosion of wires due to the charged ions, to move onto the breakdown voltage structure portion. Since an electric field in the breakdown voltage structure portion changes under an adverse effect of electric charge generated by the charged ions and the metal ions and the breakdown voltage fluctuates considerably during operation of the semiconductor device, the reliability of the semiconductor device drops.

In Patent Document 1, a field plate is disposed on a semiconductor device made of silicon, to release electric charge generated in the breakdown voltage structure portion during operation of the semiconductor device. However, as disclosed in Non-Patent Literature 2, a semiconductor device made up of a wide band gap semiconductor has an element structure formed on a semiconductor substrate having impurity concentration higher than a semiconductor device made of silicon. Therefore, FLR structure must be designed as microstructure of several μm or less, which makes it difficult to dispose a field plate on a semiconductor device made of a wide gap semiconductor. Therefore, the semiconductor device made of a wide gap semiconductor has a problem of difficulty in suppressing breakdown voltage fluctuations during operation.

One object of the present invention is to provide a semiconductor device capable of maintaining high breakdown voltage and a fabrication method of the semiconductor device so as to eliminate the problems of the conventional techniques described above. Another object of the present invention is to provide a semiconductor device with high reliability and a fabrication method of the semiconductor device so as to eliminate the problems of the conventional techniques described above.

Means for Solving Problem

To solve the problems above and achieve an object of the present invention, a semiconductor device includes a first-conductivity-type wide band gap semiconductor substrate; a first-conductivity-type wide band gap semiconductor deposition layer deposited on a surface of the first-conductivity-type wide band gap semiconductor substrate and having an impurity concentration lower than that of the first-conductivity-type wide band gap semiconductor substrate; a first second-conductivity-type semiconductor region selectively disposed in a surface layer of the first-conductivity-type wide band gap semiconductor deposition layer, on a side opposite to the first-conductivity-type wide band gap semiconductor substrate; an element structure made up of at least a metal film forming a metal-semiconductor junction on the first-conductivity-type wide band gap semiconductor deposition layer and the first second-conductivity-type semiconductor region; a second second-conductivity-type semiconductor region selectively disposed in a surface layer of the first-conductivity-type wide band gap semiconductor deposition layer, on the side opposite to the first-conductivity-type wide band gap semiconductor substrate, to surround a peripheral portion of the element structure; a third second-conductivity-type semiconductor region surrounding a peripheral portion of the second second-conductivity-type semiconductor region to make up a junction termination structure and having an impurity concentration lower than that of the second second-conductivity-type semiconductor region; and an interlayer insulation film covering the third second-conductivity-type semiconductor region. The metal film is extended on the interlayer insulation film to a position covering a portion of the third second-conductivity-type semiconductor region, via the interlayer insulation film.

In the invention above, in the semiconductor device according to the present invention, the metal film forms a Schottky junction with the first-conductivity-type wide band gap semiconductor deposition layer.

In the invention above, the semiconductor device according to the present invention further includes a second-conductivity-type wide band gap semiconductor deposition layer selectively deposited on the first-conductivity-type wide band gap semiconductor deposition layer. The metal film forms an ohmic junction with the second-conductivity-type wide band gap semiconductor deposition layer.

In the invention above, in the semiconductor device according to the present invention, the element structure is made up of a second-conductivity-type base region covering the first second-conductivity-type semiconductor region and formed by the second-conductivity-type wide band gap semiconductor deposition layer having an impurity concentration lower than that of the first second-conductivity-type semiconductor region; a first-conductivity-type source region selectively disposed within the second-conductivity-type base region; a first-conductivity-type well region penetrating the second-conductivity-type base region in a depth direction to reach the first-conductivity-type wide band gap semiconductor deposition layer; a gate electrode disposed, via a gate insulation film, on a surface of a portion of the second-conductivity-type base region interposed between the first-conductivity-type source region and the first-conductivity-type well region; and a source electrode formed by the metal film that is in contact with the second-conductivity-type base region and the first-conductivity-type source region.

In the invention above, the semiconductor device according to the present invention further includes a fourth second-conductivity-type semiconductor region surrounding a peripheral portion of the third second-conductivity-type semiconductor region to make up a junction termination structure with the third second-conductivity-type semiconductor region, and having an impurity concentration lower than that of the third second-conductivity-type semiconductor region.

In the invention above, in the semiconductor device according to the present invention, an end portion of the metal film overhangs the interlayer insulation film and is terminated on the third second-conductivity-type semiconductor region.

In the invention above, in the semiconductor device according to the present invention, an impurity concentration of the second second-conductivity-type semiconductor region is from $1.0 \times 10^{18}$ cm$^{-3}$ to $1.0 \times 10^{20}$ cm$^{-3}$.

In the invention above, in the semiconductor device according to the present invention, an impurity concentration of the third second-conductivity-type semiconductor region is from $1.0 \times 10^{17}$ cm$^{-3}$ to $1.0 \times 10^{18}$ cm$^{-3}$.

In the invention above, in the semiconductor device according to the present invention, an impurity concentration of the fourth second-conductivity-type semiconductor region is 0.4 to 0.7 times the impurity concentration of the third second-conductivity-type semiconductor region.

In the invention above, in the semiconductor device according to the present invention, the metal film is made of a group IVa metal, a group Va metal, a group VIa metal, aluminum, or silicon, or is a composite film of two or three elements thereof.

In the invention above, in the semiconductor device according to the present invention, the metal film is made of titanium, aluminum, or silicon, or is a composite film of two or three elements thereof.

In the invention above, in the semiconductor device according to the present invention, a wide band gap semiconductor is silicon carbide.

In the invention above, in the semiconductor device according to the present invention, a wide band gap semiconductor is gallium nitride.

In the invention above, in the semiconductor device according to the present invention, a Schottky barrier height of the metal film and the second-conductivity-type wide band gap semiconductor deposition layer is greater than or equal to 1.0 eV.

In the invention above, in the semiconductor device according to the present invention, a Schottky barrier height of the metal film and the second-conductivity-type wide band gap semiconductor deposition layer is greater than or equal to 0.5 eV and less than 1.0 eV.

In the invention above, in the semiconductor device according to the present invention, the first second-conductivity-type semiconductor region makes up a junction barrier Schottky structure.

To solve the problems above and achieve an object of the present invention, a fabrication method of a semiconductor device, includes depositing a first-conductivity-type wide band gap semiconductor deposition layer on a surface of a first-conductivity-type wide band gap semiconductor substrate, the first-conductivity-type wide band gap semiconductor deposition layer having an impurity concentration lower than that of the first-conductivity-type wide band gap semiconductor substrate; selectively forming a first second-conductivity-type semiconductor region in a surface layer of the first-conductivity-type wide band gap semiconductor deposition layer; selectively forming a second second-conductivity-type semiconductor region in a surface layer of the first-conductivity-type wide band gap semiconductor deposition layer to surround a peripheral portion of the first second-conductivity-type semiconductor region; selectively forming a third second-conductivity-type semiconductor region surrounding a peripheral portion of the second second-conductivity-type semiconductor region to make up a junction termination structure in a surface layer of the first-conductivity-type wide band gap semiconductor deposition layer, the third second-conductivity-type semiconductor region having an impurity concentration lower than that of the second second-conductivity-type semiconductor region; selectively forming on a surface of the first-conductivity-type wide band gap semiconductor deposition layer, an interlayer insulation film covering the third second-conductivity-type semiconductor region; forming a metal film on surfaces of the first-conductivity-type wide band gap semiconductor deposition layer and the interlayer insulation film, the metal film forming a metal-semiconductor junction with the first-conductivity-type wide band gap semiconductor deposition layer or a semiconductor layer deposited on the first-conductivity-type wide band gap semiconductor deposition layer; and selectively removing the metal film to leave the metal film such that the metal film overhangs the interlayer insulation film from the side provided with the metal-semiconductor junction and covers a portion of the third second-conductivity-type semiconductor region via the interlayer insulation film.

According to the invention described above, the portion of the electrode disposed in the active area and overhanging the interlayer insulation film can be allowed to function as a field plate. Therefore, the electric field generated in the breakdown voltage structure portion during operation of the semiconductor device can be dispersed. The electric charge generated in the breakdown voltage structure portion during operation of the semiconductor device can be released to the outside. This enables suppression of fluctuation of the breakdown voltage during operation of the semiconductor device.

According to the invention, since the termination structure is formed as the JTE structure, the field plate can be disposed easily to overhang the interlayer insulation film of the breakdown voltage structure portion by using a general method for forming the element structure of the active region as compared to the case of the FLR structure that must be designed as microstructure of several μm or less, for example. Therefore, even if a high-voltage semiconductor device is produced by using a wide band gap semiconductor device as a semiconductor material, the high-voltage semiconductor device can be produced such that the breakdown voltage hardly fluctuates during operation.

Effect of the Invention

The semiconductor device and the fabrication method of the semiconductor device according to the present invention produce an effect that high breakdown voltage can be maintained. The semiconductor device and the fabrication method of the semiconductor device according to the present invention produce an effect that reliability of the semiconductor device can be improved.

BEST MODE(S) FOR CARRYING OUT THE INVENTION

Preferred embodiments of a semiconductor device and a fabrication method of the semiconductor device according to the present invention will be described in detail with reference to the accompanying drawings. In this description and the accompanying drawings, layers and regions prefixed with n or p mean that majority carriers are electrons or positive holes, respectively. Additionally, + and − added to n or p mean that the impurity concentration is higher and lower, respectively, than layers and regions without + and −. In the following description of the embodiments and the accompanying drawings, the same constituent elements are denoted by the same reference numerals and will not repeatedly be described. In this description, when Miller indices are described, "−" means a bar added to an index immediately after the "−", and a negative index is represented by prefixing "−" to the index.

First Embodiment

Figure 1:
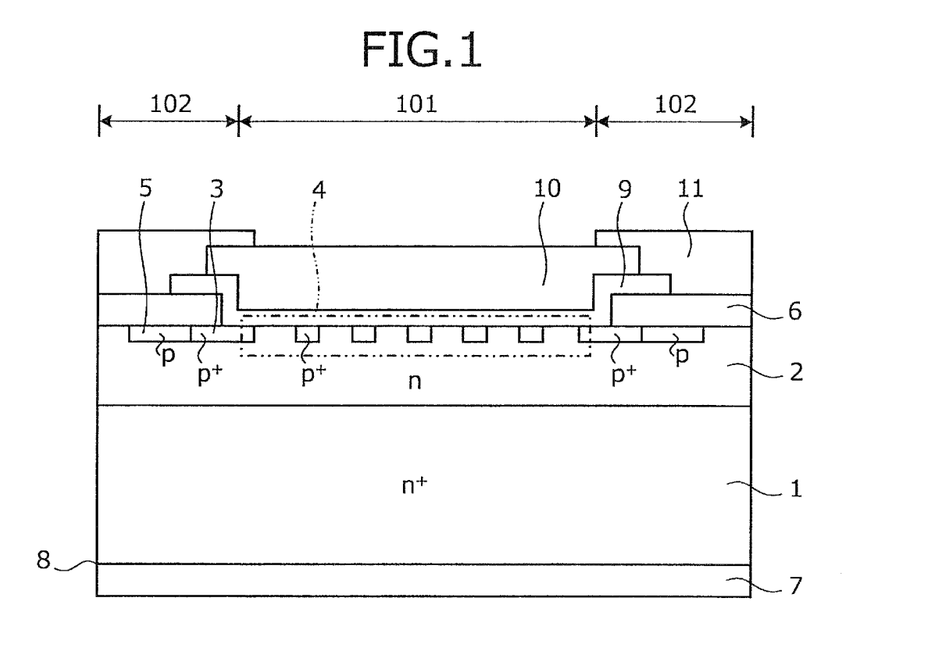
FIG. 1 is a cross-sectional view of a configuration of a silicon carbide semiconductor device according to a first embodiment.

A semiconductor according to the present invention is formed by using a wide band gap semiconductor. In a first embodiment, a silicon carbide semiconductor device produced by using, for example, silicon carbide (SiC) as a wide band gap semiconductor will be described by taking a diode in a junction barrier Schottky (JSB) structure as an example. FIG. 1 is a cross-sectional view of a configuration of a silicon carbide semiconductor device according to the first embodiment. As depicted in FIG. 1, the silicon carbide semiconductor device according to the first embodiment has an n-type silicon carbide epitaxial layer (wide band gap semiconductor deposition layer) 2 disposed on a principal surface of an n$^+$ type silicon carbide substrate (wide band gap semiconductor substrate) 1.

The n$^+$ type silicon carbide substrate 1 is a silicon carbide monocrystal substrate doped with nitrogen (N), for example. The n-type silicon carbide epitaxial layer 2 is a low-concentration n-type drift layer doped with, for example, nitrogen, at impurity concentration lower than the n$^+$ type silicon carbide substrate 1. In the following description, a silicon carbide semiconductor base refers to only the n$^+$ type silicon carbide substrate 1, or collectively refers to the n$^+$ type silicon carbide substrate 1 and the n-type silicon carbide epitaxial layer 2. P$^+$ type regions 3, 4, and a p-type region 5 are selectively disposed in a surface layer of the n-type silicon carbide epitaxial layer 2 on a side opposite to the n$^+$ type silicon carbide substrate 1 (on the front surface side of the silicon carbide semiconductor base).

The p$^+$ type region (second second-conductivity-type semiconductor region) 3 is disposed in a breakdown voltage structure portion 102 disposed in a peripheral portion of an active region 101, to surround the active region 101. The breakdown voltage structure portion 102 is a region retaining breakdown voltage. The p$^+$ type region 3 is disposed closer to the active region 101 in which a diode element structure is disposed and is in contact with a Schottky electrode 9 that forms a Schottky junction with the n-type silicon carbide epitaxial layer 2. The Schottky electrode 9 will be described later.

The p$^+$ type region 3 is doped with, for example, aluminum (Al) to have an impurity concentration that is higher than the p-type region 5. The impurity concentration of the p$^+$ type region 3 is preferably from $1.0 \times 10^{18}$ cm$^{-3}$ to $1.0 \times 10^{20}$ cm$^{-3}$. This is because the effects of the present invention notably appear. The p$^+$ type region 3 has a function of avoiding concentration of electric field on an end portion of junction between the n-type silicon carbide epitaxial layer 2 and the Schottky electrode 9.

The multiple p$^+$ type regions (first second-conductivity-type semiconductor regions) 4 are disposed in the active region 101 at predetermined intervals to make up a JBS structure (element structure) (portion indicated by dashed-two dotted line). The p$^+$ type regions 4 are disposed separately from the p$^+$ type region 3. The impurity concentration of the p$^+$ type regions 4 may be equal to the impurity concentration of the p$^+$ type region 3. The p-type region (third second-conductivity-type semiconductor region) 5 is disposed to be in contact with a peripheral portion of the p$^+$ type region 3 and surrounds the p$^+$ type region 3 to make up a junction termination (JTE) structure. Therefore, the p$^+$ type region 3 and the p-type region 5 are arranged in this order, in parallel, from the side of the active region 101 toward the breakdown voltage structure portion 102.

The impurity concentration of the p-type region 5 is preferably $1.0 \times 10^{17}$ cm$^{-3}$ to $1.0 \times 10^{18}$ cm$^{-3}$. This is because a desired breakdown voltage is more easily acquired and the effects of the present invention notably appear. The p-type region 5 has a function of further dispersing the electric field in the peripheral portion of the active region 101. The p$^+$ type region 4 and the p-type region 5 are respectively doped with aluminum, for example.

An interlayer insulation film 6 is disposed on the breakdown voltage structure portion 102 to cover a portion of the p$^+$ type region 3 closer to the p-type region 5, and the p-type region 5. A back surface electrode (ohmic electrode) 7 forming an ohmic junction 8 with the n$^+$ type silicon carbide substrate 1 is disposed on a surface of the n$^+$ type silicon carbide substrate 1, on the side opposite to the n-type silicon carbide epitaxial layer 2 (on the back surface of the silicon carbide semiconductor base). The back surface electrode 7 makes up a cathode electrode. The Schottky electrode 9 making up an anode electrode is disposed on the surface of the n-type silicon carbide epitaxial layer 2, on the side opposite to the n$^+$ type silicon carbide substrate 1 (on the front surface of the silicon carbide semiconductor base). The Schottky electrode 9 is disposed across the active region 101 and a portion of the breakdown voltage structure portion 102.

For example, the Schottky electrode 9 covers the entire surface of the n-type silicon carbide epitaxial layer 2 (front surface of the silicon carbide semiconductor base) exposed in the active region 101 and comes into contact with the p$^+$ type region 3 in the peripheral portion of the active region 101. The Schottky electrode 9 is disposed to extend from the active region 101 to the breakdown voltage structure portion 102 and overhangs the interlayer insulation film 6. The Schottky electrode 9 is extended on the interlayer insulation film 6 to a position covering the p$^+$ type region 3 and a portion of the p-type region 5, via the interlayer insulation film 6. Therefore, an end portion of the Schottky electrode 9, most extended into the breakdown voltage structure portion 102, is terminated on the p-type region 5 for the JTE structure. A portion of the Schottky electrode 9 overhanging the interlayer insulation film 6 acts as a field plate (FP) releasing the electric charge generated in the breakdown voltage structure portion 102.

The Schottky electrode 9 is preferably made of the following materials because the effects of the present invention notably appear. The Schottky electrode 9 is preferably made of a group IVa metal, a group Va metal, a group VIa metal, aluminum, or silicon. Alternatively, the Schottky electrode 9 is preferably made of a composite film of two or three elements among a group IVa metal, a group Va metal, a group VIa metal, aluminum, and silicon. Particularly, the Schottky electrode 9 is made of titanium (Ti), aluminum, or silicon, or is preferably a composite film of two or three elements among titanium (Ti), aluminum, and silicon. More preferably, in the Schottky electrode 9, a portion forming the Schottky joint with the n-type silicon carbide epitaxial layer 2 is made of titanium (Ti), for example.

If the silicon carbide semiconductor device according to the first embodiment is used as a high-voltage semiconductor device, a Schottky barrier height of the Schottky electrode 9 and the n-type silicon carbide epitaxial layer 2 is preferably greater than or equal to 1 eV, for example. If the silicon carbide semiconductor device according to the first embodiment is used as a power source device, a Schottky barrier height of the Schottky electrode 9 is preferably greater than or equal to 0.5 eV and less than 1 eV, for example.

For example, an electrode pad 10 made of aluminum is disposed on the Schottky electrode 9. The electrode pad 10 extends from the active region 101 to the breakdown voltage structure portion 102, and an end portion thereof most extended into the breakdown voltage structure portion 102 is terminated on the Schottky electrode 9. For example, a protection film 11 such as a passivation film made of polyimide is disposed on the JTE structure to cover the end portions of the Schottky electrode 9 and the electrode pad 10, most extended into the breakdown voltage structure portion 102. The protection film 11 has a function of preventing discharge.

Figure 2:
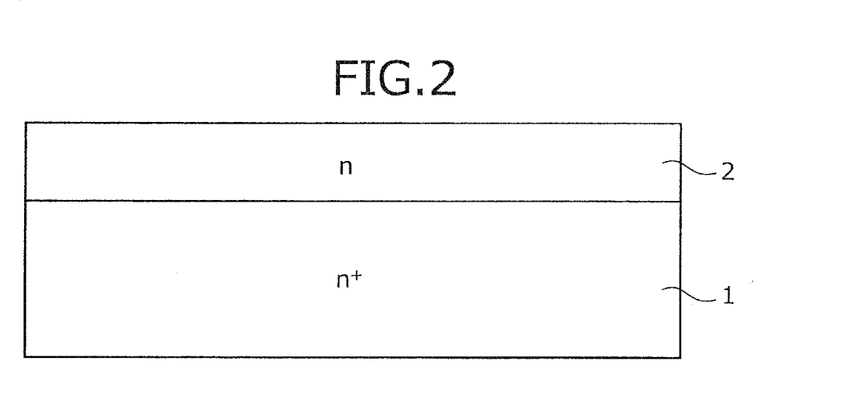
FIG. 2 is a schematic cross-sectional view of a state during fabrication of the silicon carbide semiconductor device according to the first embodiment.
Figure 3:
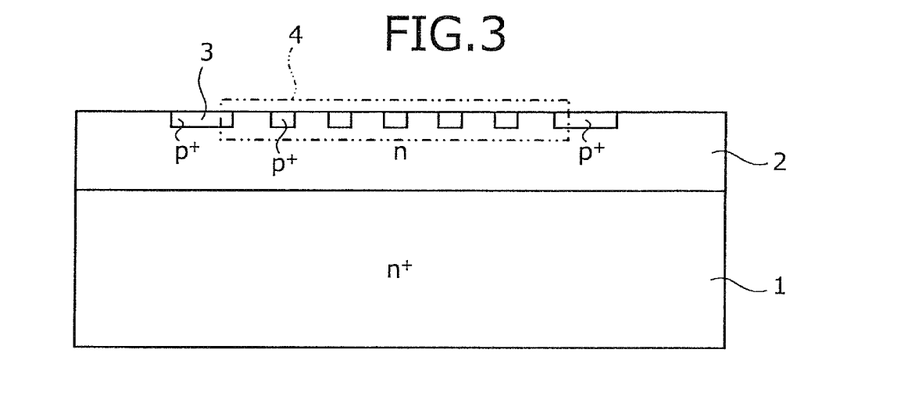
FIG. 3 is a schematic cross-sectional view of a state during fabrication of the silicon carbide semiconductor device according to the first embodiment.
Figure 4:
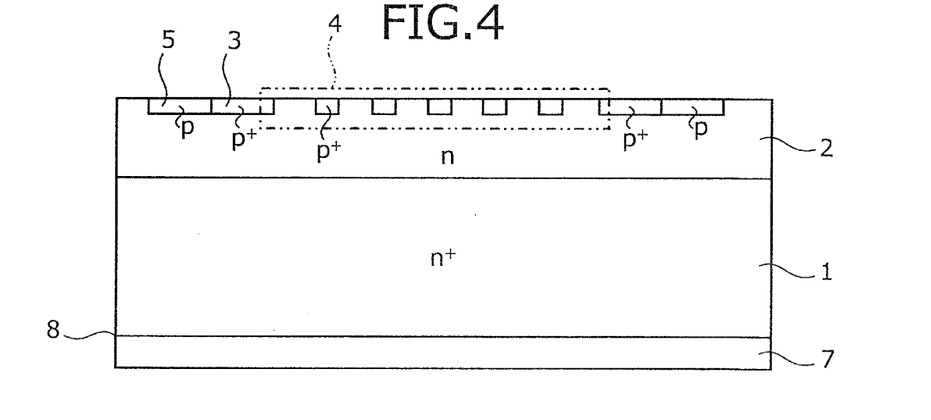
FIG. 4 is a schematic cross-sectional view of a state during fabrication of the silicon carbide semiconductor device according to the first embodiment.

A method of fabricating the silicon carbide semiconductor device according to the first embodiment will be described by taking as an example the case of producing a high-voltage diode in the JBS structure having a breakdown voltage rating of 600 V or higher, for example. FIGS. 2, 3 and 4 are schematic cross-sectional views of states during fabrication of the silicon carbide semiconductor device according to the first embodiment. First, as depicted in FIG. 2, the n$^+$ type silicon carbide substrate 1 doped with nitrogen at an impurity concentration of $1 \times 10^{18}$ cm$^{-3}$, for example, is prepared. The principal surface of the n+ type silicon carbide substrate 1 may be a (0001) plane, for example.

On the (0001) plane of the n+ type silicon carbide substrate 1, the 10-μm-thick n-type silicon carbide epitaxial layer 2 doped with nitrogen at an impurity concentration of $1.0 \times 10^{16}$ cm$^{-3}$ is grown. As depicted in FIG. 3, the p$^+$ type region 3 for the termination structure and the p+ type regions 4 for the JBS structure are selectively formed in the surface layer of the n-type silicon carbide epitaxial layer 2 by photolithography and ion implantation. The p+ type regions 3 and 4 are formed by multi-stage ion implantation of, for example, aluminum, with a box profile to a depth of 0.5 μm at an impurity concentration of $3 \times 10^{19}$ cm$^{-3}$.

The ion implantation for forming the p+ type regions 3 and 4 may be performed with acceleration energy and doping concentration being changed in five stages, for example. In this case, for example, the acceleration energy and the doping concentration of first to fifth implantations may be 300 KeV and $5 \times 10^{14}$ ions/cm$^2$, 200 KeV and $3 \times 10^{14}$ ions/cm$^2$, 150 KeV and $3 \times 10^{14}$ ions/cm$^2$, 100 KeV and $2 \times 10^{14}$ ions/cm$^2$, and 50 KeV and $3 \times 10^{14}$ ions/cm$^2$, respectively.

As depicted in FIG. 4, the p-type regions 5 for the JTE structure are selectively formed in the surface layer of the n-type silicon carbide epitaxial layer 2 by photolithography and ion implantation. In this ion implantation, for example, aluminum is implanted at a dopant concentration of $3 \times 10^{17}$ cm$^{-3}$. Heat activation treatment is performed in an argon (Ar) atmosphere at a temperature of 1650 degrees C. for 240 seconds to activate the aluminum implanted in the n-type silicon carbide epitaxial layer 2.

For example, a 0.5-μm-thick oxide film is formed as the interlayer insulation film 6 on the entire surface of the n-type silicon carbide epitaxial layer 2 (front surface of the silicon carbide semiconductor base). The interlayer insulation film 6 is patterned and selectively removed to expose the n-type silicon carbide epitaxial layer 2 in the active region 101 and portions of the p+ type region 3 in the active region 101. As a result, the interlayer insulation film 6 is formed to cover the portion of the p+ type region 3 closer to the p-type region 5 and the p-type region 5. A nickel (Ni) film is formed with a thickness of 50 nm as the back surface electrode 7 on the surface of the n+ type silicon carbide substrate 1 (back surface of the silicon carbide semiconductor base). Heat treatment is performed in an argon atmosphere at a temperature of 1100 degrees C. for 2 minutes. This heat treatment forms the ohmic junction 8 between the n+ type silicon carbide substrate 1 and the back surface electrode 7.

For example, a titanium film is formed over the entire surface on the front surface side of the silicon carbide semiconductor base as the Schottky electrode 9 with a thickness of 100 nm, to be in contact with the n-type silicon carbide epitaxial layer 2 exposed in the active region 101. The titanium film on the breakdown voltage structure portion 102 is selectively removed such that an end portion of the titanium film, most extended into the breakdown voltage structure portion 102, is terminated on the p-type region 5. Heat treatment is performed in an argon atmosphere at a temperature of 500 degrees C. for 5 minutes. This heat treatment forms the Schottky junction between the n-type silicon carbide epitaxial layer 2 and the Schottky electrode 9.

For example, an aluminum film of a thickness of 5 μm is deposited, as the electrode pad 10, over the entire front surface of the silicon carbide semiconductor base to cover the Schottky electrode 9. The aluminum film is selectively removed such that an end portion of the titanium film, most extended into the breakdown voltage structure portion 102, is located on the breakdown voltage structure portion 102 and terminated on the Schottky electrode 9. Subsequently, the protection film 11 made of polyimide and for preventing discharge is formed to have, for example, a thickness of 8 μm, to complete the diode in the JBS structure depicted in FIG. 1.

As described above, according to the first embodiment, since the electrode disposed in the active region is configured to overhang the interlayer insulation film covering the JTE structure, a portion of the electrode overhanging the interlayer insulation film can be allowed to function as a field plate. Therefore, the portion of the electrode overhanging the interlayer insulation film can disperse the electric field generated in the breakdown voltage structure portion during operation of the semiconductor device. The portion of the electrode overhanging the interlayer insulation film can release to the outside, the electric charge generated in the breakdown voltage structure portion during operation of the semiconductor device. As a result, fluctuation of the breakdown voltage can be suppressed during operation of the semiconductor device. Therefore, the reliability of the semiconductor device can be improved.

According to the first embodiment, since the termination structure is formed as the JTE structure, the field plate can be formed easily to overhang the interlayer insulation film of the breakdown voltage structure portion by using a general method for forming the element structure of the active region as compared to the FLR structure that must be designed as microstructure of several μm or less, for example. Therefore, even if a high-voltage semiconductor device is produced by using a wide band gap semiconductor device as a semiconductor material, the high-voltage semiconductor device can be produced such that the breakdown voltage hardly fluctuates during operation.

Second Embodiment

Figure 5:
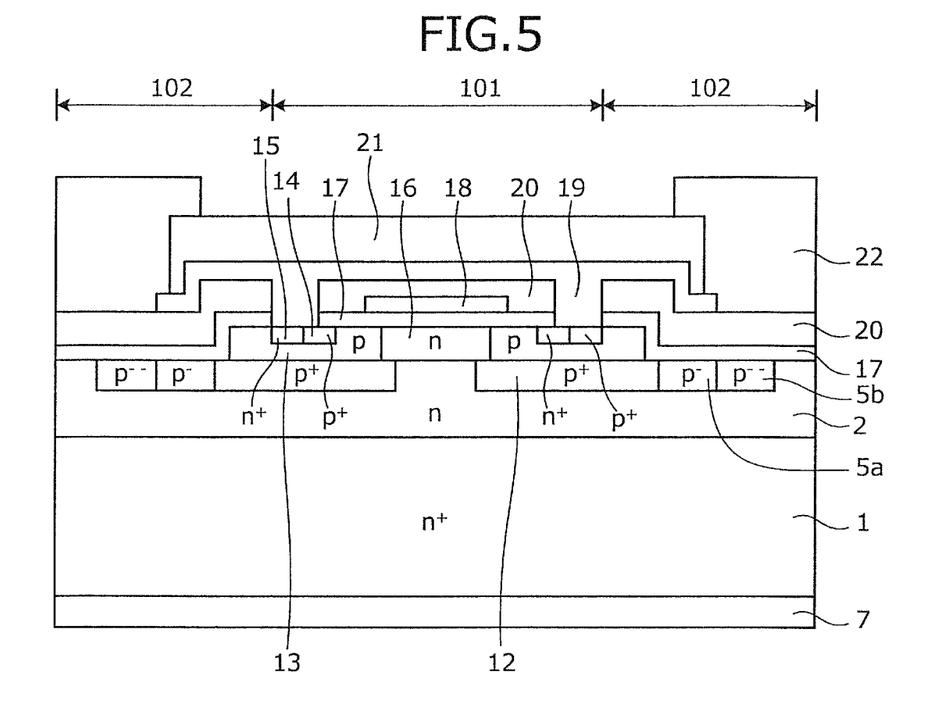
FIG. 5 is a cross-sectional view of a configuration of the silicon carbide semiconductor device according to a second embodiment.

FIG. 5 is a cross-sectional view of a configuration of the silicon carbide semiconductor device according to a second embodiment. The silicon carbide semiconductor device according to the second embodiment is different from the silicon carbide semiconductor device according to the first embodiment in that a MOSFET element structure is formed instead of a diode element structure. The silicon carbide semiconductor device according to the second embodiment will be described by taking a MOSFET in vertical planar gate structure as an example. In the second embodiment, the silicon carbide semiconductor base collectively refers to the n+ type silicon carbide substrate 1, the n-type silicon carbide epitaxial layer 2, and a p-base layer 13 described later.

As depicted in FIG. 5, the silicon carbide semiconductor device according to the second embodiment has the n-type silicon carbide epitaxial layer 2 deposited on the principal surface of the n+ type silicon carbide substrate 1 acting as a drain region. The n+ type silicon carbide substrate 1 and the n-type silicon carbide epitaxial layer 2 are the same as the n+ type silicon carbide substrate and the n-type silicon carbide epitaxial layer of the first embodiment. The back surface electrode 7 is disposed on the surface of the n+ type silicon carbide substrate 1, on the side opposite to the n-type silicon carbide epitaxial layer 2 (on the back surface of the silicon carbide semiconductor base) as is the case with the first embodiment. The back surface electrode 7 makes up a drain electrode.

In the active region 101, a MOS (insulation gate formed by a metal/oxide film/semiconductor) structure (element structure) is formed on the front surface side of the silicon carbide semiconductor base. For example, in the active region 101, P+ regions (first second-conductivity-type semiconductor regions) 12 are selectively disposed in a surface layer of the n-type silicon carbide epitaxial layer 2 on the side opposite to the n+ semiconductor substrate 1 (on the front surface side of the silicon carbide semiconductor base). The P+ regions 12 are doped with aluminum, for example.

A p-type silicon carbide epitaxial layer (hereinafter referred to as p-base layer; second-conductivity-type wide band gap semiconductor deposition layer) 13 is selectively deposited on surfaces of the adjacent P+ regions 12 and the n-type silicon carbide epitaxial layer 2 interposed between the adjacent P+ regions 12. The p-base layer 13 is disposed only in the active region 101. The impurity concentration of the p-base layer 13 is lower than the impurity concentration of the P+ regions 12. The p-base layer 13 is doped with aluminum, for example.

An $n^+$ source region 14 and a $p^+$ contact region 15 are disposed in a portion of the p-base layer 13 on the P+ region 12. The $n^+$ source region 14 is disposed from a surface of the p-base layer 13, on the side opposite to the P+ region 12, to a depth not reaching the P+ region 12. The source region 14 and the $p^+$ contact region 15 contact each other. The $p^+$ contact region 15 is disposed closer to the breakdown voltage structure portion 102 than the $n^+$ source region 14.

In portion of the p-base layer 13 on the n-type silicon carbide epitaxial layer 2, an n-well region 16 is disposed penetrating the p-base layer 13 in the depth direction and reaching the n-type silicon carbide epitaxial layer 2. The n-well region 16 makes up a drift region with the n-type silicon carbide epitaxial layer 2. A gate electrode 18 is disposed via a gate insulation film 17 on a surface of a portion of the p-base layer 13 interposed between the $n^+$ source region 14 and the n-well region 16. The gate electrode 18 may be disposed on a surface of the n-well region 16, via the gate insulation film 17.

An interlayer insulation film 20 is disposed on the entire front surface side of the silicon carbide semiconductor base to cover the gate electrode 18. A source electrode 19 comes into contact with the $n^+$ source region 14 and the $p^+$ contact region 15 through a contact hole opened in the interlayer insulation film 20. The source electrode 19 is electrically insulated from the gate electrode 18, by the interlayer insulation film 20.

The source electrode 19 extends from the active region 101 to the breakdown voltage structure portion 102 and overhangs the interlayer insulation film 20 of the breakdown voltage structure portion 102. The source electrode 19 covers a portion of a $p^-$ type region 5a described later, via the interlayer insulation film 20. Therefore, an end portion of the source electrode 19, most extended into the breakdown voltage structure portion 102, is terminated on the $p^-$ type region 5a for JTE structure. A portion of the source electrode 19 overhanging the interlayer insulation film 20 acts as a field plate (FP) releasing the electric charge generated in the breakdown voltage structure portion 102.

An electrode pad 21 is disposed on the source electrode 19. The electrode pad 21 extends from the active region 101 to the breakdown voltage structure portion 102, and an end portion thereof most extended into the breakdown voltage structure portion 102 is terminated on the source electrode 19. For example, a protection film 22 such as a passivation film made of polyimide is disposed on the breakdown voltage structure portion 102 to cover the end portions of the source electrode 19 and the electrode pad 21, most extended into the breakdown voltage structure portion 102. The protection film 22 has a function of discharge prevention.

In the breakdown voltage structure portion 102, the $p^-$ type region (third second-conductivity-type semiconductor regions) 5a and a $p^{--}$ type region (fourth second-conductivity-type semiconductor regions) 5b are disposed in a surface layer of the n-type silicon carbide epitaxial layer 2 on the side opposite to the $n^+$ type silicon carbide substrate 1. The $p^-$ type region 5a and the $p^{--}$ type region 5b make up a double zone JTE structure. The JTE structure is electrically insulated by the interlayer insulation film 20 from the element structure of the active region. The double zone JTE structure is a JTE structure configured such that two p-type regions with different impurity concentrations are arranged in parallel in contact with each other.

The $p^-$ type region 5a is in contact with a peripheral portion of the P+ regions 12 and surrounds the P+ regions 12. The $p^{--}$ type region 5b is in contact with a peripheral portion of the P− regions 5a and surrounds the P− regions 5a. Therefore, the $p^+$ type region 12, the $p^-$ type region 5a, and the $p^{--}$ type region 5b are arranged in this order, in parallel, from the side of the active region 101 toward the breakdown voltage structure portion 102. The impurity concentration of the P− regions 5a is lower than the impurity concentration of the p-base layer 13. The impurity concentration of the $p^{--}$ type region 5b is lower than the impurity concentration of the $p^-$ type region 5a.

Preferably, the impurity concentration of the $p^{--}$ type region 5b is 0.4 to 0.7 times the impurity concentration of the $p^-$ type region 5a because the effects of the present invention notably appear. Both the $p^-$ type region 5a and the $p^{--}$ type region 5b are doped with aluminum, for example. Although only one MOS structure is depicted in the active region in FIG. 5, multiple MOS structures may be arranged in parallel.

A method of fabricating the silicon carbide semiconductor device according to the second embodiment will be described by taking as an example the case of creating a MOSFET of a 1200-V breakdown voltage rating, for example. First, the $n^+$ type silicon carbide substrate 1 doped with nitrogen at an impurity concentration of $2 \times 10^{19}$ cm$^{-3}$, for example, is prepared. The $n^+$ type silicon carbide substrate 1 may have a principal surface that is a (000-1) plane having an off-angle of about 4 degrees in a <11-20> direction, for example. On the (000-1) plane of the n+ type silicon carbide substrate 1, the 10-μm-thick n-type silicon carbide epitaxial layer 2 doped with nitrogen at an impurity concentration of $1.8 \times 10^{16}$ cm$^{-3}$ is grown.

The $p^+$ type regions 12 are selectively formed in the surface layer of the n-type silicon carbide epitaxial layer 2 by photolithography and ion implantation. In this ion implantation, for example, aluminum may be used as a dopant and a dosage may be set such that an impurity concentration of $1.0 \times 10^{18}$ cm$^{-3}$ is achieved in the P+ regions 12. The width and depth of the $p^+$ type regions 12 may be 13 μm and 0.5 μm, respectively. A distance between the adjacent P+ regions 12 may be 2 μm, for example.

A p-type silicon carbide epitaxial layer acting as the p-base layer 13 is grown to, for example, a thickness of 0.5 μm, on the surfaces of the n-type silicon carbide epitaxial layer 2. In this case, for example, the p-type silicon carbide epitaxial layer doped with aluminum may be grown such that an impurity concentration of $2.0 \times 10^{16}$ cm$^{-3}$ is achieved in the p-base layer 13.

The conductivity type of a portion of the p-base layer 13 on the n-type silicon carbide epitaxial layer 2 is inverted by photolithography and ion implantation to selectively form the n-well region 16. In this ion implantation, for example, nitrogen may be used as a dopant and a dosage may be set such that an impurity concentration of $5.0 \times 10^{16}$ cm$^{-3}$ is achieved in the n-well region 16. The width and depth of the n-well region 16 may be 2.0 μm and 1.5 μm, respectively.

The $n^+$ source region 14 is selectively formed by photolithography and ion implantation in the surface layer of a portion of the p-base layer 13 on the P+ region 12. The $p^+$ contact region 15 is selectively formed by photolithography and ion implantation in the surface layer of a portion of the p-base layer 13 on the P+ region 12. Heat treatment (annealing) for activating the n+ source region 14, the p+ contact region 15, and the n-well region 16 is then performed. Heat treatment time and heat treatment temperature in this case may be 1620 degrees C. and 2 minutes, respectively.

The p-base layer 13 on the breakdown voltage structure portion 102 is removed by etching to a depth of 0.7 µm to expose the n-type silicon carbide epitaxial layer 2. The p⁻ type region 5a is then selectively formed by photolithography and ion implantation in the surface layer of the n-type silicon carbide epitaxial layer 2 exposed by the etching. In this ion implantation, for example, aluminum may be used as a dopant and a dosage may be set to $6.0 \times 10^{13}$ cm$^{-2}$.

The p⁻⁻ type region 5b is then selectively formed by photolithography and ion implantation in the surface layer of the n-type silicon carbide epitaxial layer 2 exposed by the etching. In this ion implantation, for example, aluminum may be used as a dopant and a dosage may be set to $1.0 \times 10^{13}$ cm$^{-3}$. Heat treatment (annealing) for activating the p⁻ type region 5a and the p⁻⁻ type region 5b is then performed. Heat treatment time and heat treatment temperature in this case may be 1620 degrees C. and 2 minutes, respectively.

The heat treatment for activating the p⁻ type region 5a and the p⁻⁻ type region 5b may be performed at the same time with the heat treatment for activating the n+ source region 14, the p+ contact region 15, and the n-well region 16. The order of formation of the n+ source region 14, the p+ contact region 15, the n-well region 16, the p⁻ type region 5a, and the p⁻⁻ type region 5b can be changed variously.

The front surface side of the silicon carbide semiconductor base is thermally-oxidized to form the gate insulating film 17 to a thickness of 100 nm. This thermal oxidization may be performed in a hydrogen atmosphere by heat treatment at a temperature of about 1000 degrees C. As a result, the regions formed on the surfaces of the p-base layer 13 and the n-type silicon carbide epitaxial layer 2 are covered by the gate insulating film 17.

A polycrystalline silicon layer doped with, for example, phosphorus (P) is formed as the gate electrode 18 on the gate insulating film 17. The polycrystalline silicon layer is patterned and selectively removed to leave the polycrystalline silicon layer on a portion of the p-base layer 13 interposed between the n+ source region 14 and the n-well region 16. In this case, the polycrystalline silicon layer may be left on the n-well region 16.

A 1.0-µm-thick film of phosphorus glass (phospho silicate glass (PSG)) is formed as the interlayer insulation film 20 to cover the gate insulating film 17. The interlayer insulation film 20 and the gate insulating film 17 are patterned and selectively removed to form a contact hole and expose the n+ source region 14 and the p+ contact region 15. Heat treatment (reflow) for flattening the interlayer insulation film 20 is performed.

A film of the source electrode 19 is formed on the surface of the interlayer insulation film 20. The source electrode 19 is embedded in the contact hole to bring the n+ source region 14 and the p+ contact region 15 into contact with the source electrode 19. The source electrode 19 on the breakdown voltage structure portion 102 is selectively removed such that the end portion of the source electrode 19, most extended into the breakdown voltage structure portion 102, is terminated on the p⁻ type region 5a.

The electrode pad 21 is deposited by, for example, the sputtering method, on the entire front surface of the silicon carbide semiconductor base to cover the source electrode 19. A thickness of a portion of the electrode pad 21 on the interlayer insulation film 20 may be 5 µm, for example. The electrode pad 21 may be made of aluminum including silicon at a rate of 1% (Al—Si), for example. The electrode pad 21 is selectively removed such that an end portion of the electrode pad 21, most extended into the breakdown voltage structure portion 102, is located on the breakdown voltage structure portion 102 and terminated on the source electrode 19.

For example, a nickel film is formed as the back surface electrode 7 on a surface of the n+ type silicon carbide substrate 1 (back surface of the silicon carbide semiconductor base). Heat treatment is performed at, for example, a temperature of 970 degrees C., to form the ohmic junction 8 between the n+ type silicon carbide substrate 1 and the back surface electrode 7. Subsequently, for example, films of titanium, nickel, and gold (Au) are formed in this order as the back surface electrode 7 on the surface of the nickel film. The protection film 22 is formed on the front surface side of the silicon carbide semiconductor base to cover the end portions of the source electrode 19 and the electrode pad 21, most extended into the breakdown voltage structure portion 102, to complete the MOSFET depicted in FIG. 5.

As described above, according to the second embodiment, the same effects as the first embodiment can be acquired even if the MOSFET element structure is formed.

Example

Figure 6A:
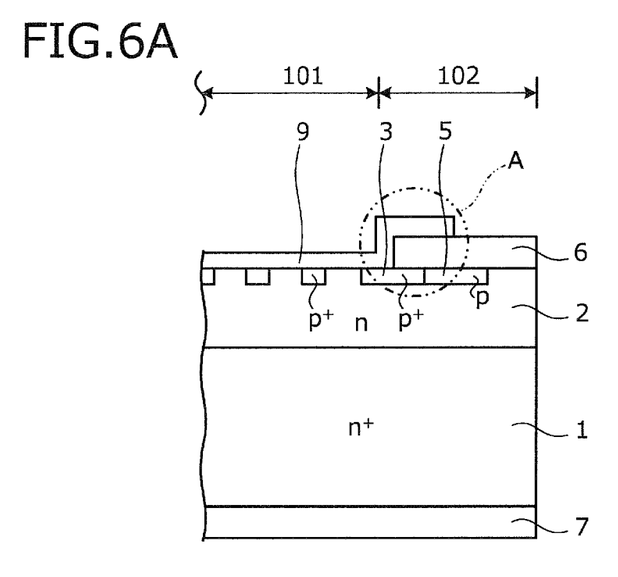
FIG. 6A is a cross-sectional view of a configuration of a breakdown voltage structure portion of a silicon carbide semiconductor device according to an example.
Figure 6B:
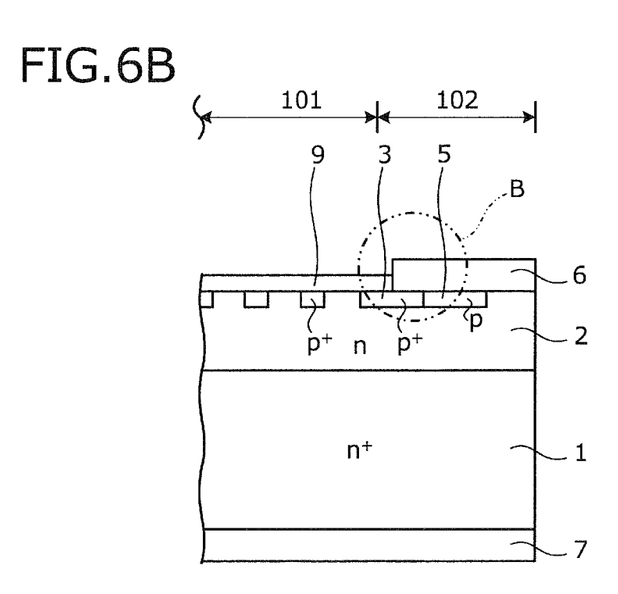
FIG. 6B is a cross-sectional view of a configuration of a breakdown voltage structure portion of a silicon carbide semiconductor device according to a comparison example.

Tests were conducted for the breakdown voltage characteristics of the silicon carbide semiconductor device corresponding to the presence/absence of a field plate. FIG. 6A is a cross-sectional view of a configuration of a breakdown voltage structure portion of a silicon carbide semiconductor device according to an example. FIG. 6B is a cross-sectional view of a configuration of a breakdown voltage structure portion of a silicon carbide semiconductor device according to a comparison example. First, a diode in the JBS structure was produced according to the first embodiment. For example, as depicted in FIG. 6A, the diode was created such that the Schottky electrode 9 was allowed to overhang the interlayer insulation film 6 of the breakdown voltage structure portion 102 and such that a portion of the Schottky electrode 9 on the interlayer insulation film 6 is allowed to function as a field plate (a portion indicated by reference numeral A; hereinafter referred to as "with a field plate").

Figure 7A:
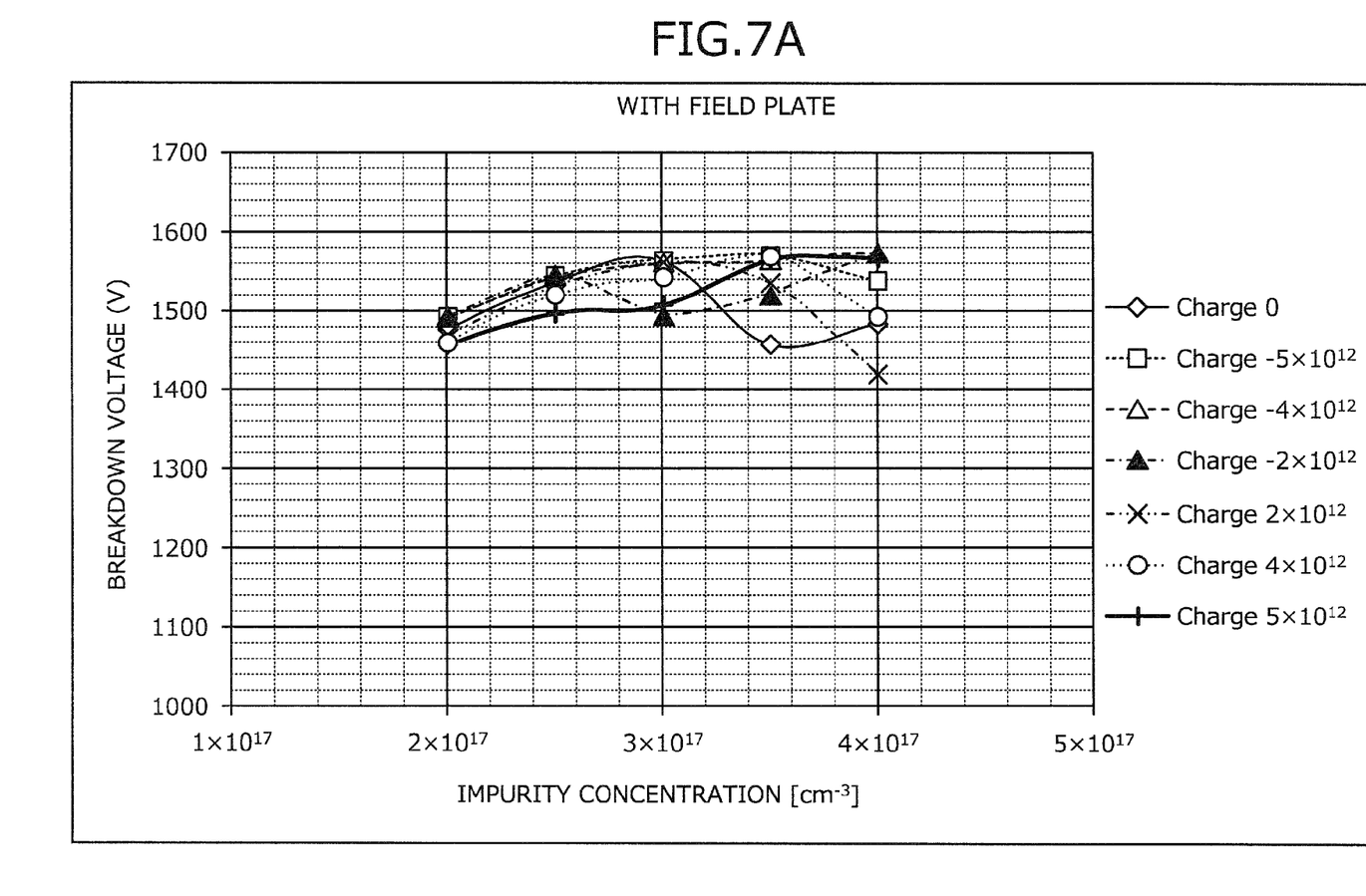
FIG. 7A is a characteristic diagram of breakdown voltage characteristics of the silicon carbide semiconductor device according to the example.
Figure 7B:
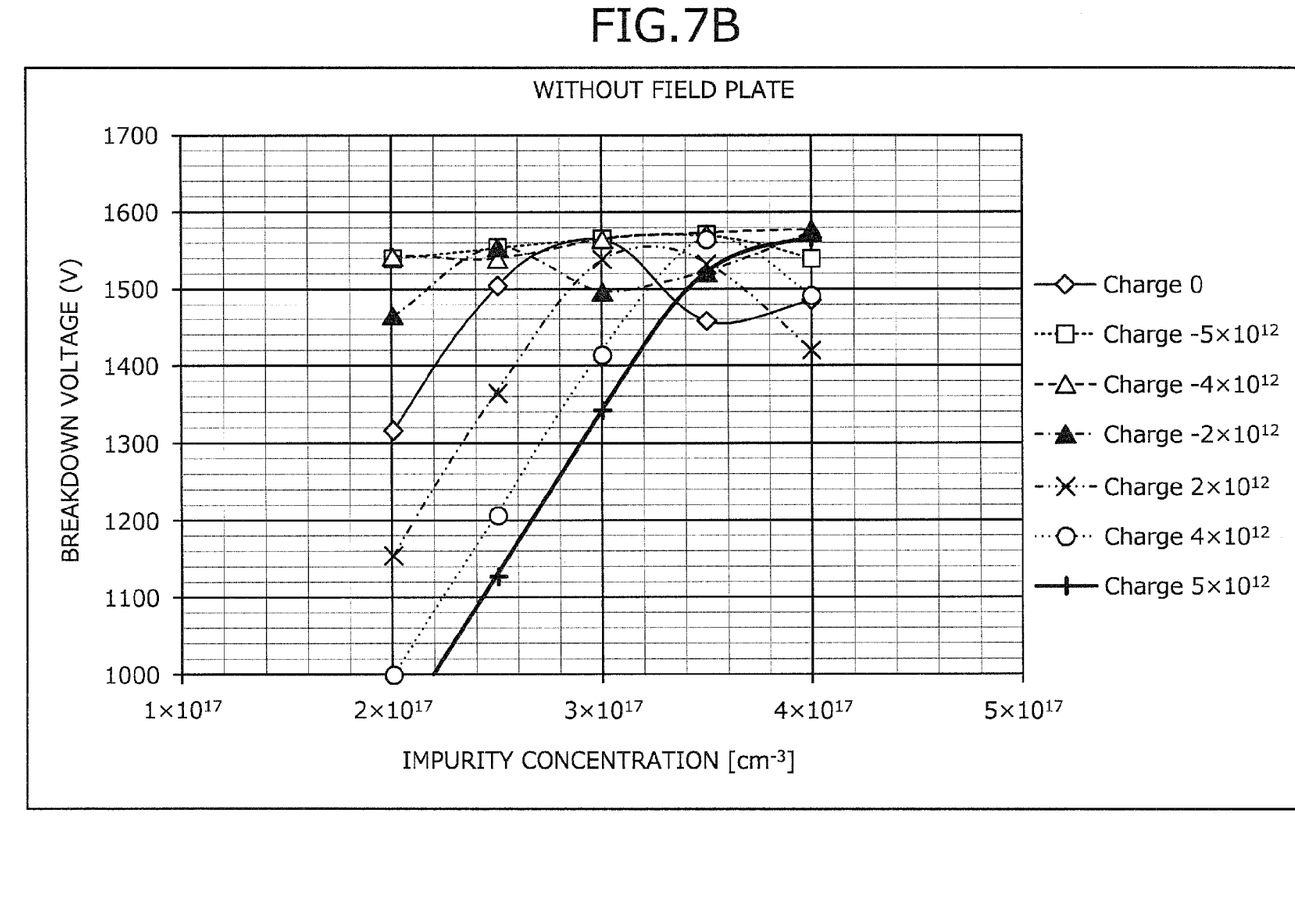
FIG. 7B is a characteristic diagram of breakdown voltage characteristics of the silicon carbide semiconductor device according to the comparison example.

For comparison, as depicted in FIG. 6B, a diode was created such that the Schottky electrode 9 was not allowed to overhang the interlayer insulation film 6 of the breakdown voltage structure portion 102 (a portion indicated by reference numeral B; hereinafter referred to as "without a field plate"). The example and the comparison example have the same configuration excluding the Schottky electrode 9. For example, thickness of the interlayer insulation film 6 was 0.5 µm. Concentration and thickness of the epitaxial layer 2 were $1 \times 10^{16}$ cm$^{-3}$ and 10 µm, respectively. The width and depth of the p-type region 5 were 30 µm and 0.5 µm. The impurity concentration of the p-type region 5 was changed within a range of $2 \times 10^{17}$ cm$^{-3}$ to $4 \times 10^{17}$ cm$^{-3}$ to calculate respective breakdown voltages of the example and the comparison example when electric charge was distributed on the interlayer insulation film 6 at an electric charge amount from $-5 \times 10^{12}$ cm$^{-2}$ to $+5 \times 10^{12}$ cm$^{-2}$. The simulation results are depicted in FIGS. 7A and 7B.

7A is a characteristic diagram of breakdown voltage characteristics of the silicon carbide semiconductor device according to the example. FIG. 7B is a characteristic diagram of breakdown voltage characteristics of the silicon carbide semiconductor device according to the comparison example. As depicted in FIG. 7A, it was confirmed that almost no fluctuation of breakdown voltage was recognized in the example with a field plate. Although FIG. 7A depicts only the simulation result within a range of the impurity concentration of the p-type region 5 from $2\times10^{17}$ cm$^{-3}$ to $4\times10^{17}$ cm$^{-3}$ under the condition that the epitaxial layer 2 has a concentration of $1\times10^{16}$ cm$^{-3}$ and a thickness of 10 μm, when the concentration of the epitaxial layer 2 becomes lower, no fluctuation of breakdown voltage occurs in a range of the impurity concentration of the p-type region 5 greater than or equal to $1.0\times10^{17}$ cm$^{-3}$ and less than $2\times10^{17}$ cm$^{-3}$, and when the concentration of the epitaxial layer 2 becomes higher, almost no fluctuation of breakdown voltage occurs if the impurity concentration of the p-type region 5 is larger than $4\times10^{17}$ cm$^{-3}$ and equal to or less than $1.0\times10^{18}$ cm$^{-3}$. On the other hand, as depicted in FIG. 7B, it was confirmed that the breakdown voltage is reduced by 500 V or more depending on the electric charge amount on the interlayer insulation film 6 in the comparison example without a field plate. Therefore, it is confirmed that the electrode disposed in the active region can be configured to overhang the interlayer insulation film covering the JTE structure, so as to suppress fluctuation of breakdown voltage and implement a high breakdown voltage greater than or equal to 1400 V, for example.

Although the present invention has been described by taking as an example a configuration in which the principal surface of the silicon carbide substrate made of silicon carbide is a (0001) plane with a Schottky barrier diode formed on the (0001) plane, this is not a limitation, and the plane orientation of the principal substrate surface and the wide band gap semiconductor material making up the substrate may be changed variously. For example, the principal surface of the silicon carbide substrate may be a (000-1) plane and a Schottky barrier diode may be formed on the (000-1) plane, or the semiconductor substrate may be made of a wide band gap semiconductor such as gallium nitride (GaN).

Although a diode in the JBS structure or a vertical MOSFET is taken as an example in the description of the present invention, the present invention is applicable not only to the embodiment described above but also to semiconductor devices of various configurations including the breakdown voltage structure portion surrounding the active region. Therefore, the configuration of the element structure of the active region may be a configuration in which the junction between each region making up the element structure and a wide band gap semiconductor base includes metal-semiconductor junction, or a configuration in which the junction includes metal-semiconductor junction and insulator-semiconductor junction. The element structure including only the metal-semiconductor junction is element structure of a diode, for example. The element structure including the metal-semiconductor junction and the insulator-semiconductor junction is element structure of a MOSFET, for example.

Although titanium is taken as an example of the metal forming the Schottky junction with the silicon carbide semiconductor base in the present invention, this is not a limitation, and the Schottky electrode may be made of material capable of forming the Schottky junction with the silicon carbide semiconductor base. Although the double zone JTE structure is described as a configuration example of the JTE structure, the JTE structure may be multi-zone JTE structure configured such that three or more p-type regions with different impurity concentrations are arranged in parallel in contact with each other. Although the case of forming the JTE structure in the breakdown voltage structure portion is taken as an example in the description, the present invention may be applied to termination structure of a configuration in which multiple p-type regions are arranged at predetermined intervals as in the FLR structure regardless of a difficulty level of fabricating. Although the first conductivity type is the n-type and the second conductivity type is the p-type in the embodiments, the present invention is implemented in the same way even when the first conductivity type is the p-type while the second conductivity type is the n-type.

INDUSTRIAL APPLICABILITY

As described above, the semiconductor device and the fabrication method of the semiconductor device according to the present invention are useful for a high-voltage semiconductor device used in power converters and power source devices of various industrial machines.

EXPLANATIONS OF LETTERS OR NUMERALS 1 n$^+$ type silicon carbide substrate
2 n-type silicon carbide epitaxial layer
3 p$^+$ type region disposed in a peripheral portion of an active region
4 p$^+$ type region for JBS structure
5 p-type region for JTE structure
6 interlayer insulation film
7 back surface electrode
8 ohmic junction
9 Schottky electrode
10 electrode pad
11 protection film
101 active region
120 breakdown voltage structure portion

The invention claimed is:
1. A semiconductor device comprising:
a first-conductivity-type wide band gap semiconductor substrate;
a first-conductivity-type wide band gap semiconductor layer disposed on a surface of the first-conductivity-type wide band gap semiconductor substrate and having an impurity concentration lower than that of the first-conductivity-type wide band gap semiconductor substrate;
a first second-conductivity-type semiconductor region selectively disposed in a surface layer of the first-conductivity-type wide band gap semiconductor layer, on a side opposite to the first-conductivity-type wide band gap semiconductor substrate;
an element structure made up of at least a metal film forming a metal-semiconductor junction on the first-conductivity-type wide band gap semiconductor layer and the first second-conductivity-type semiconductor region;
a second second-conductivity-type semiconductor region selectively disposed in a surface layer of the first-conductivity-type wide band gap semiconductor layer, on the side opposite to the first-conductivity-type wide band gap semiconductor substrate, to surround a peripheral portion of the element structure;
a third second-conductivity-type semiconductor region surrounding a peripheral portion of the second second-conductivity-type semiconductor region to make up a junction termination structure and having an impurity concentration lower than that of the second second-conductivity-type semiconductor region; and
an interlayer insulation film covering the third second-conductivity-type semiconductor region, wherein
the metal film is extended continuously over the first second-conductivity-type semiconductor region, the second second-conductivity-type semiconductor region and on the interlayer insulation film to a position directly overlying a portion of the third second-conductivity-type semiconductor region, via the interlayer insulation film.

2. The semiconductor device of claim 1, wherein the metal film forms a Schottky junction with the first-conductivity-type wide band gap semiconductor layer.

3. The semiconductor device of claim 1, further comprising a second-conductivity-type wide band gap semiconductor layer selectively disposed on the first-conductivity-type wide band gap semiconductor layer, wherein the metal film forms an ohmic junction with the second-conductivity-type wide band gap semiconductor layer.

4. The semiconductor device of claim 3, wherein the element structure is made up of
   a second-conductivity-type base region covering the first second-conductivity-type semiconductor region and formed by the second-conductivity-type wide band gap semiconductor layer having an impurity concentration lower than that of the first second-conductivity-type semiconductor region,
   a first-conductivity-type source region selectively disposed within the second-conductivity-type base region,
   a first-conductivity-type well region penetrating the second-conductivity-type base region in a depth direction to reach the first-conductivity-type wide band gap semiconductor layer,
   a gate electrode disposed, via a gate insulation film, on a surface of a portion of the second-conductivity-type base region interposed between the first-conductivity-type source region and the first-conductivity-type well region, and
   a source electrode formed by the metal film that is in contact with the second-conductivity-type base region and the first-conductivity-type source region.

5. The semiconductor device of claim 3, wherein a Schottky barrier height of the metal film and the second-conductivity-type wide band gap semiconductor layer is greater than or equal to 1.0 eV.

6. The semiconductor device of claim 3, wherein a Schottky barrier height of the metal film and the second-conductivity-type wide band gap semiconductor layer is greater than or equal to 0.5 eV and less than 1.0 eV.

7. The semiconductor device of claim 1, further comprising a fourth second-conductivity-type semiconductor region surrounding a peripheral portion of the third second-conductivity-type semiconductor region to make up a junction termination structure with the third second-conductivity-type semiconductor region, and having an impurity concentration lower than that of the third second-conductivity-type semiconductor region.

8. The semiconductor device of claim 7, wherein an impurity concentration of the fourth second-conductivity-type semiconductor region is 0.4 to 0.7 times the impurity concentration of the third second-conductivity-type semiconductor region.

9. The semiconductor device of claim 1, wherein an end portion of the metal film overhangs the interlayer insulation film and is terminated on the third second-conductivity-type semiconductor region.

10. The semiconductor device of claim 1, wherein an impurity concentration of the second second-conductivity-type semiconductor region is from $1.0 \times 10^{18}$ cm$^{-3}$ to $1.0 \times 10^{20}$ cm$^{-3}$.

11. The semiconductor device of claim 1, wherein an impurity concentration of the third second-conductivity-type semiconductor region is from $1.0 \times 10^{17}$ cm$^{-3}$ to $1.0 \times 10^{18}$ cm$^{-3}$.

12. The semiconductor device of claim 1, wherein the metal film is made of a group IVa metal, a group Va metal, a group VIa metal, aluminum, or silicon, or is a composite film of two or three elements thereof.

13. The semiconductor device of claim 1, wherein the metal film is made of titanium, aluminum, or silicon, or is a composite film of two or three elements thereof.

14. The semiconductor device of claim 1, wherein a wide band gap semiconductor is silicon carbide.

15. The semiconductor device of claim 1, wherein a wide band gap semiconductor is gallium nitride.

16. The semiconductor device of claim 1, wherein the first second-conductivity-type semiconductor region makes up a junction barrier Schottky structure.

17. A fabrication method of a semiconductor device, the fabrication method comprising:
   depositing a first-conductivity-type wide band gap semiconductor layer on a surface of a first-conductivity-type wide band gap semiconductor substrate, the first-conductivity-type wide band gap semiconductor layer having an impurity concentration lower than that of the first-conductivity-type wide band gap semiconductor substrate;
   selectively forming a first second-conductivity-type semiconductor region in a surface layer of the first-conductivity-type wide band gap semiconductor layer;
   selectively forming a second second-conductivity-type semiconductor region in a surface layer of the first-conductivity-type wide band gap semiconductor layer to surround a peripheral portion of the first second-conductivity-type semiconductor region;
   selectively forming a third second-conductivity-type semiconductor region surrounding a peripheral portion of the second second-conductivity-type semiconductor region to make up a junction termination structure in a surface layer of the first-conductivity-type wide band gap semiconductor layer, the third second-conductivity-type semiconductor region having an impurity concentration lower than that of the second second-conductivity-type semiconductor region;
   selectively forming on a surface of the first-conductivity-type wide band gap semiconductor layer, an interlayer insulation film covering the third second-conductivity-type semiconductor region;
   forming a metal film on surfaces of the first-conductivity-type wide band gap semiconductor layer and the interlayer insulation film, the metal film forming a metal-semiconductor junction with the first-conductivity-type wide band gap semiconductor layer or a semiconductor layer disposed on the first-conductivity-type wide band gap semiconductor layer; and
   selectively removing the metal film to leave the metal film such that the metal film is extended continuously over the first second-conductivity-type semiconductor region, the second second-conductivity-type semiconductor region and overhangs the interlayer insulation film from the side provided with the metal-semiconductor junction and directly overlies a portion of the third second-conductivity-type semiconductor region via the interlayer insulation film.

* * * * *